(12) United States Patent
Yang et al.

(10) Patent No.: US 10,707,282 B1
(45) Date of Patent: Jul. 7, 2020

(54) ORGANIC LIGHT-EMITTING DIODE DISPLAY PANELS

(71) Applicant: Apple Inc., Cupertino, CA (US)

(72) Inventors: Chih Jen Yang, Cupertino, CA (US); Prashant Mandlik, Sunnyvale, CA (US); Chia-Hao Chang, Taoyuan (TW); Chien-Chung Wang, Tainan (TW); Te-Hua Teng, Tainan (TW); Yu Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 16/000,725

(22) Filed: Jun. 5, 2018

Related U.S. Application Data

(60) Provisional application No. 62/556,232, filed on Sep. 8, 2017.

(51) Int. Cl.
*H01L 27/32* (2006.01)
*G06F 3/041* (2006.01)
*H01L 51/52* (2006.01)

(52) U.S. Cl.
CPC .......... *H01L 27/3246* (2013.01); *G06F 3/041* (2013.01); *H01L 27/323* (2013.01); *H01L 27/3262* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 7,931,516 B2 | 4/2011 | Aota | |
| 9,614,183 B2 | 4/2017 | Zhang et al. | |
| 2015/0379921 A1 | 12/2015 | Lee et al. | |
| 2016/0204373 A1* | 7/2016 | Park | H01L 27/3244 257/40 |
| 2016/0315284 A1 | 10/2016 | Jeon | |
| 2017/0005155 A1 | 1/2017 | You et al. | |
| 2017/0279079 A1 | 9/2017 | Kim et al. | |
| 2017/0345881 A1* | 11/2017 | Kim | H01L 27/3262 |
| 2018/0097198 A1* | 4/2018 | Chou | H01L 51/5253 |

\* cited by examiner

*Primary Examiner* — Grant S Withers
(74) *Attorney, Agent, or Firm* — Treyz Law Group, P.C.; G. Victor Treyz; Matthew R. Williams

(57) ABSTRACT

A display may have organic light-emitting diode pixels formed from thin-film circuitry. An organic layer including planarization layers and a pixel definition layer may overlap the thin-film circuitry. Thin-film encapsulation may overlap the organic layer. The thin-film encapsulation may be formed from an organic dielectric layer interposed between two layers of inorganic dielectric material. A strip of peripheral crack-stopper structures may run along an edge of the display and may surround the array of pixels. The crack-stopper structures may include parallel inorganic lines formed from a first inorganic layer such as an inorganic layer of the thin-film circuitry. A strip of the organic layer may overlap the parallel inorganic lines. The crack-stopper structures may have parallel tapered polymer lines. The polymer lines may be overlapped by a second inorganic dielectric layer formed from the inorganic material of the thin-film encapsulation layer.

20 Claims, 6 Drawing Sheets

ORGANIC LIGHT-EMITTING DIODE DISPLAY PANELS

This application claims the benefit of provisional patent application No. 62/556,232, filed Sep. 8, 2017, which is hereby incorporated by reference herein in its entirety.

BACKGROUND

This relates generally to electronic devices, and, more particularly, to electronic devices with displays.

Electronic devices such as cellular telephones, computers, and other electronic devices often contain displays. A display includes an array of pixels for displaying images to a user. In an organic light-emitting diode display, pixels are formed from thin-film circuitry. A thin-film encapsulation layer is used to protect the pixels from damage due to environmental exposure. The thin-film encapsulation layer includes inorganic dielectric.

The thin-film circuitry for multiple display panels can be fabricated on a common substrate. Following fabrication, individual display panels can be cut from the common substrate using a laser. The inorganic dielectric is prone to cracking as display panels are cut from the common substrate. To prevent cracking and to ensure that structures such as bond pads are not coated with inorganic dielectric, chemical vapor deposition shadow masks are used to block inorganic dielectric deposition around the periphery of each display panel where the panels are cut from the substrate. This type of arrangement places a premium on shadow mask accuracy and may create inactive border areas on the display panels that are larger than desired.

SUMMARY

A display may have an array of pixels. Each pixel may have a light source so that the array of pixels may display images. The pixels may be organic light-emitting diode pixels formed from a layer of thin-film circuitry or other suitable pixels. An organic layer including planarization layers and a pixel definition layer may overlap the thin-film circuitry.

Thin-film encapsulation may overlap the organic layer. The thin-film encapsulation may be formed from a layer of material in which organic dielectric material is interposed between two layers of inorganic dielectric material.

A strip of peripheral crack-stopper structures may run along an edge of the display and may surround the array of pixels. The crack-stopper structures may include parallel inorganic lines formed from a first inorganic dielectric layer such as an inorganic dielectric layer of the thin-film transistor circuitry. A strip of the organic layer may overlap the parallel inorganic dielectric lines and may run parallel to the edge of the display. The crack-stopper structures may have parallel polymer lines. The polymer lines may be overlapped by a second inorganic dielectric layer formed from the inorganic dielectric material of the thin-film encapsulation layer.

DETAILED DESCRIPTION

Figure 1:
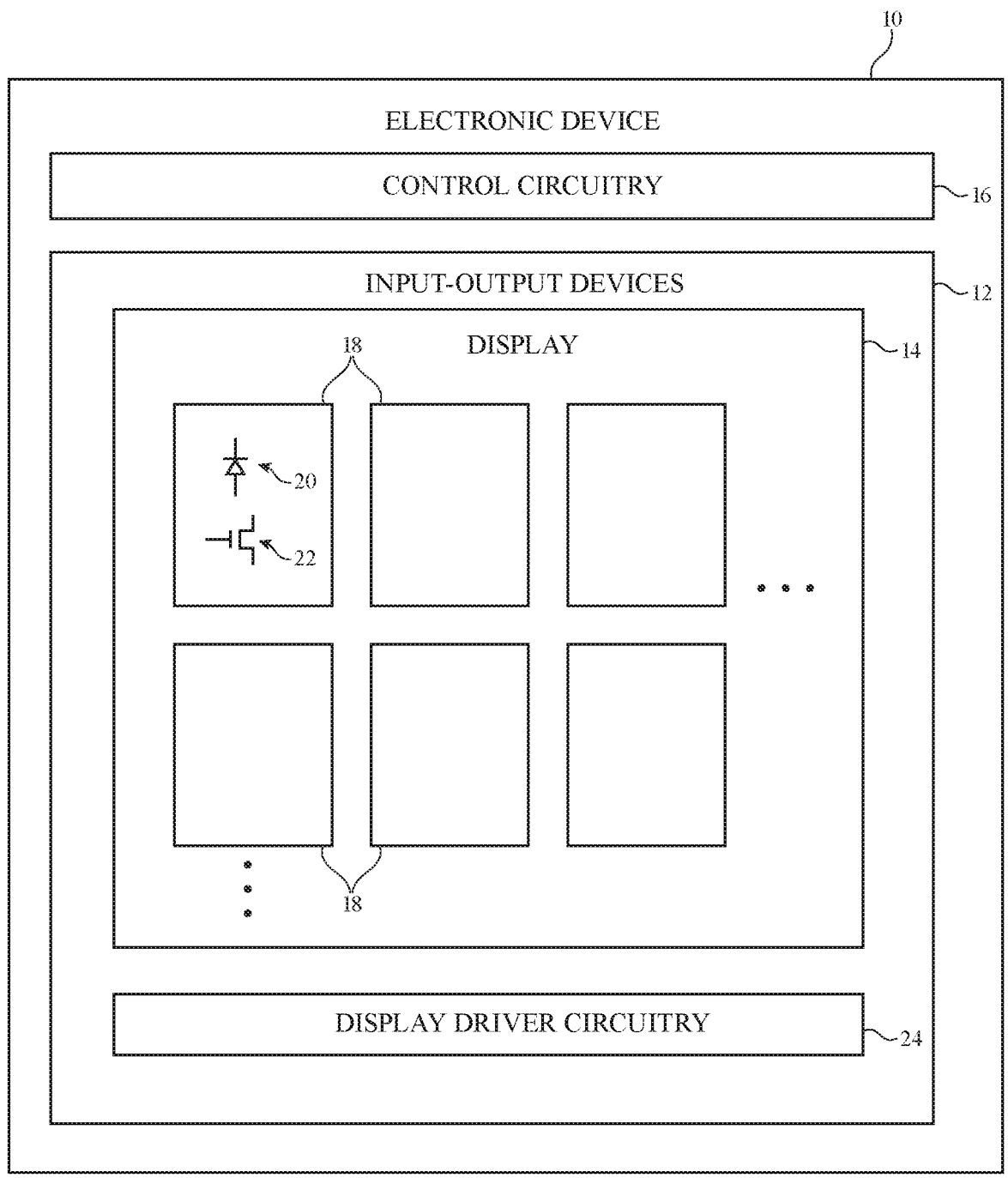
FIG. 1 is a schematic diagram of an illustrative electronic device having a display in accordance with an embodiment.

An illustrative electronic device of the type that may be provided with a display is shown in FIG. 1. Electronic device 10 of FIG. 1 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Display 14 may be an organic light-emitting diode display or other suitable display. Configurations in which display 14 is an organic light-emitting diode display are sometimes described herein as an example.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

As shown in FIG. 1, display 14 may have an array of pixels 18 configured to display images for a user. Pixels 18 may each include one or more thin-film transistors 22 for forming a pixel control circuit and may each include a respective organic light-emitting diode 20 that is controlled by the pixel control circuitry of that pixel 18. Display driver circuitry 24 may be formed from thin-film transistor circuitry and/or integrated circuit(s) and may be used in supplying image data and control signals to pixels 18 during operation of display 14.

Figure 2:
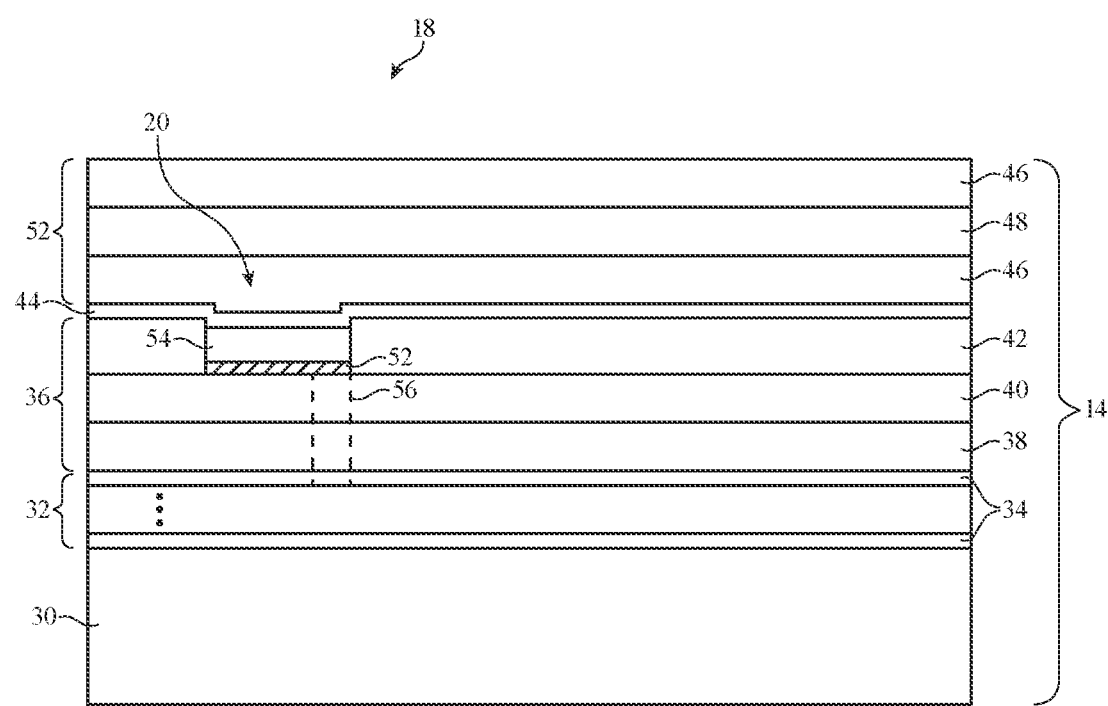
FIG. 2 is a cross-sectional side view of a portion of an illustrative display in accordance with an embodiment.

FIG. 2 is a cross-sectional side view of a portion of an illustrative inorganic light-emitting diode display such as display 14. As shown in FIG. 2, display 14 may include a substrate such as substrate 30. Substrate 30 may be formed from polymer (e.g., polyimide), glass, or other material. A layer of thin-film transistor circuitry for forming pixel circuits such as thin-film transistor circuitry 32 may be formed on substrate 30. Circuitry 32 may include layers of material 34 such as buffer layers, semiconductor layers (e.g., a layer of polysilicon for forming silicon thin-film transistors, a layer of semiconducting oxide such as indium gallium zinc oxide for forming semiconducting-oxide thin-film transistors, or other suitable semiconductor layers), metal layers (e.g., metal traces for routing, vias, transistor terminals, capacitors, etc.), and dielectric layers (e.g., gate insulator, interlayer dielectric, and/or other inorganic dielectric layers and, if desired, organic dielectric layers). The thin-film circuitry of display 14 also includes organic layers of material such as organic layer 36. Organic layer 36 may be formed on the circuitry of thin-film transistor layer 32. Layer 36 may include one or more planarization layers such as planarization layers 38 and 40 and pixel definition layer 42. Layers 38, 40, and 42 may be formed from polymer. Pixel 18 may include organic light-emitting diode 20. Diode 20 may have an anode 52 formed from a conductive layer on layer 40 within an opening in pixel definition layer 42, may have organic emissive material 54 in the opening in pixel definition layer 42, and may have a conductive cathode formed from cathode layer 44. Via 56 may couple the thin-film circuitry of diode 20 to other thin-film transistor circuitry such as the circuitry of thin-film circuitry layer 32.

To prevent degradation of the array of pixels 18 in display 14, display 14 may be covered with a layer of thin-film encapsulation such as thin-film encapsulation layer 52. Encapsulation layer 52 may help prevent intrusion of moisture and oxygen to the thin-film circuitry forming pixels 18. Thin-film encapsulation layer 52 may include one or more inorganic layers and one or more organic layers. In the example of FIG. 2, thin-film encapsulation layer 52 includes an organic layer such as polymer layer 48 that is sandwiched between opposing upper and lower layers of inorganic dielectric 46. Inorganic dielectric 46 may be formed from a material such as silicon nitride (as an example). The presence of polymer layer 48 helps decouple the upper silicon nitride layer in layer 52 from the lower silicon nitride layer in layer 52 and reduces degradation of encapsulation layer 52 due to cracking.

Figure 3:
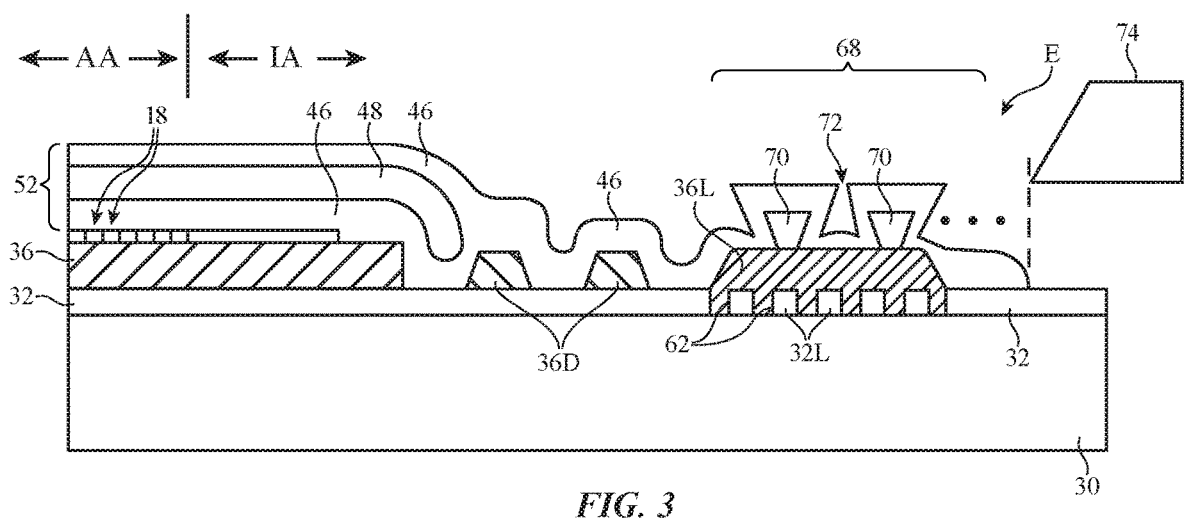
FIG. 3 is a cross-sectional side view of an illustrative edge portion of an illustrative display with crack stopper border structures in accordance with an embodiment.

FIG. 3 is a cross-sectional side view of an edge portion of display 14. FIG. 3 shows how pixels 18 may be formed in an active area AA of display 14 (e.g., a central portion of display 14 that is configured to display images for a user) and shows how inactive border area IA, which runs around the periphery of display 14, is free of pixels 18 and does not display images.

Thin-film circuitry layer 32 contains inorganic dielectric layers that extend into inactive area IA. Inorganic dielectric layer 46 of thin-film encapsulation layer 52 (FIG. 2) also extends into inactive border area IA. In the absence of crack prevention structures, these two layers of inorganic dielectric may be vulnerable to cracking along the edge of display 14.

Dam structures 36D may help contain thin-film encapsulation layer 52 within the center of display 14 and may be formed from concentric peripheral lines that are patterned from layer 36.

To prevent cracks and delamination of layers 46 and 32, display 14 may be provided with a peripheral crack-stopper structure (sometimes referred to as a crack prevention structure, crack-stopper strip, crack-stopper line, etc.) such as peripheral crack-stopper structure 68. Crack-stopper structure 68 may be used to prevent crack propagation and film delamination in layers of display 14 such as layer 32 and 46. As shown in FIG. 3, crack stopper structures 68 may include a series of parallel lines 32L of the inorganic dielectric layer in layer 32. Lines 32L form line-shaped gaps such as slots 62 in the inorganic dielectric layer portion of layer 32 that extends into inactive area IA. Each slot 62 may be interposed between a pair of adjacent lines 32L in layer 32. Slots 62 and lines 32L may run parallel to peripheral edge E of display 14 (e.g., into the page in the orientation of FIG. 3).

Crack-stopper structure 68 may include a portion of organic layer 36 such as peripheral strip 36L. Strip 36L may extend along peripheral display edge E and may cover slots 62 and lines 32L.

Crack-stopper structure 68 may include one or more tapered lines 70 (lines with tapered cross-sectional profiles) on the strip of layer 36 that covers lines 32L and slots 62 of crack-stopper structure (line) 68. Lines 70 may run parallel to edge E and may be formed from a layer of organic material (e.g., polymer) such as a layer of negative photoresist that has been exposed and developed to form tapered sidewalls. The sidewalls of lines 70 taper outwardly at increasing distances from the surface of layer 36 (e.g., lines 70 have lower portions near layer 36 that are narrower than their upper portions).

Due to the presence of lines 70, dielectric layer 46 is weaker (e.g., less dense and/or thinner) in areas such as gap 72 between a pair of adjacent lines 70 (e.g., where chemical reactions are starved for reactant) and/or is entirely missing in gaps such as gap 72 and/or other areas under the overhangs created by the tapered sidewalls of lines 70. The presence of these weaker regions of layer 46 helps prevent cracks from propagating from the edge E of display 14 inwardly past crack-stopper structure 68 towards active area AA. At the same time, the presence of slots 62 in layer 32 helps prevent cracks in the inorganic dielectric of layer 32 in inactive area IA from propagating from the edge E of display 14 inwardly past crack-stopper structures 68. Cracks-stopper structure 68 is patterned photolithographically, which relieves the burden that would otherwise be placed on the accuracy of the location of the edge of chemical vapor deposition mask 74. As a result, the amount of margin required to accommodate chemical vapor deposition shadow mask 74 may be reduced and the size of the inactive border of display 14 may be reduced.

Figure 4:
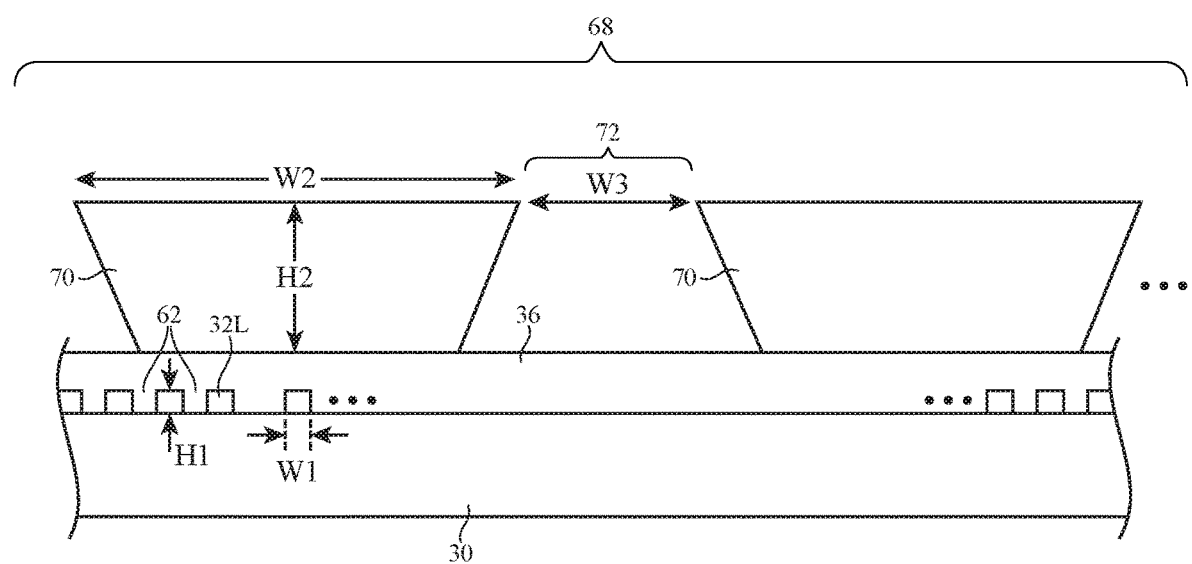
FIG. 4 is a cross-sectional side view of illustrative crack stopper structures in accordance with an embodiment.

As shown in FIG. 4, lines 32L may be characterized by width W1. Lines 32L may be characterized by height H1.

Each line 70 may have a width W2 and a height H2 and may be separated by a gap 72 of width W3. Crack stopper structures 68 may include any suitable number of lines 70 (e.g., 1-10, at least 3, at least 5, fewer than 15, etc.). Height H1 of lines 32L may be 0.8 microns, at least 0.4 microns, less than 1.2 microns, or other suitable height. Width W1 may be 4 microns, at least 2 microns, less than 6 microns, or other suitable width. Slots 62 may have widths of 6 microns, at least 3 microns, less than 9 microns, or other suitable width. The height H2 of lines 70 may be 3 microns, at least 2 microns, less than 4 microns, or other suitable height. The width W2 of lines 70 may be 5 microns, at least 3 microns, less than 7 microns, or other suitable width. Width W3 may be 5 microns, at least 2 microns, less than 8 microns, or other suitable width. The thickness of layer 36 may be, for example, 1-2 microns or other suitable thickness.

For satisfactory crack stopping, it may be desirable for the value of W3 to be less than W2, or, more preferably less than half of W2. Other ratios of W3 to W2 may be used, if desired.

Figure 5:
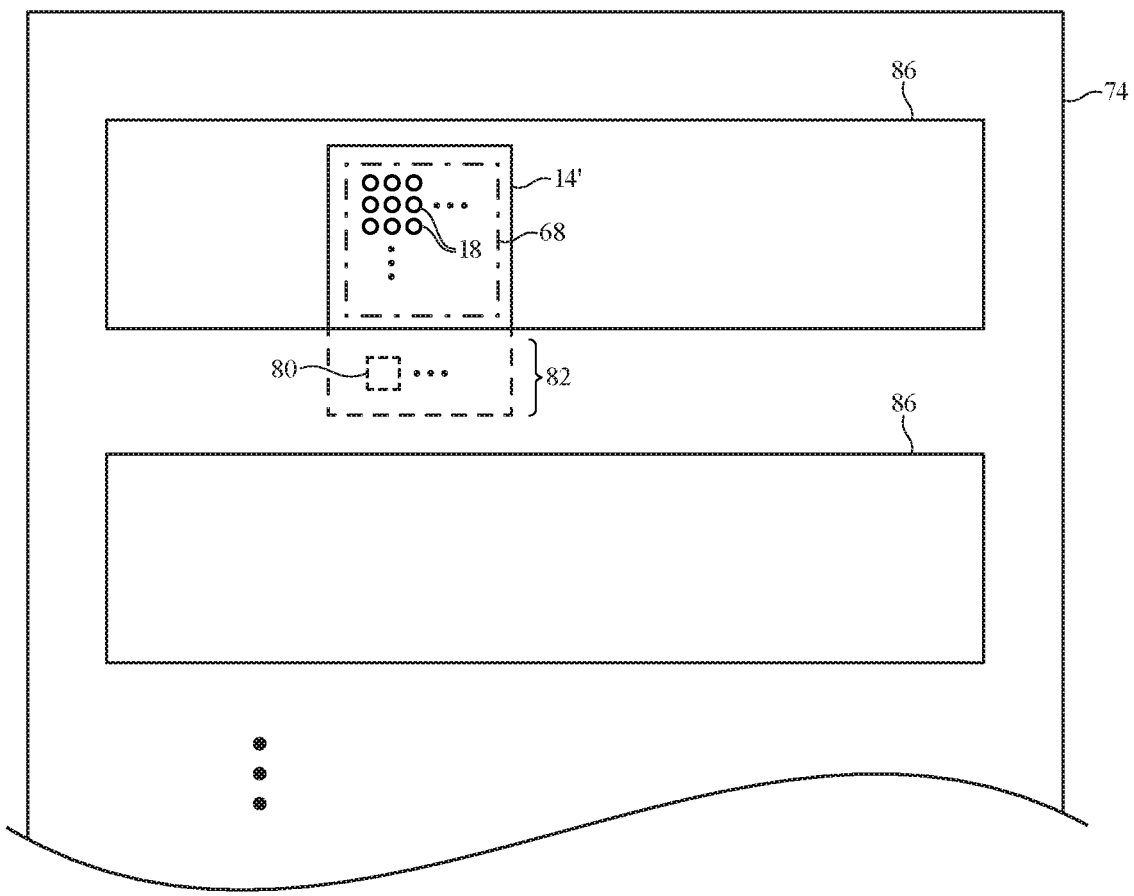
FIG. 5 is a top view of an illustrative chemical vapor deposition shadow mask having elongated openings overlapping an illustrative display panel area in accordance with an embodiment.

An illustrative chemical vapor deposition shadow mask that may be used to pattern layer 46 during chemical vapor deposition operations is shown in FIG. 5. As shown in FIG. 5, mask 74 may have a series of elongated rectangular openings 86 through which layer 46 is deposited. A common substrate layer (e.g., substrate 30) corresponding to an array of display panels may be overlapped by mask 74, so that each opening 86 overlaps a corresponding row of pixel arrays (arrays of pixels 18). Each pixel array may be surrounded by a peripheral line of crack-stopper structures 68. As shown by illustrative display area 14' of FIG. 5, mask 74 may overlap the edge portion of each display that contains bond pads 80. If desired, tape-based masking or other dielectric patterning schemes may be used in ensuring that bond pads 80 are not covered with dielectric. The configuration of FIG. 5 is merely illustrative. By using an arrangement of the type shown in FIG. 5 in which each panel has a peripheral crack-stopper structure 68 (crack-stopper line) surrounding its pixel array, it is not necessary to use an array of individual rectangular openings in mask 74, thereby reducing the challenges associated with creating and aligning the edges of panel-sized mask openings with the structures of each display 14.

Figure 6:
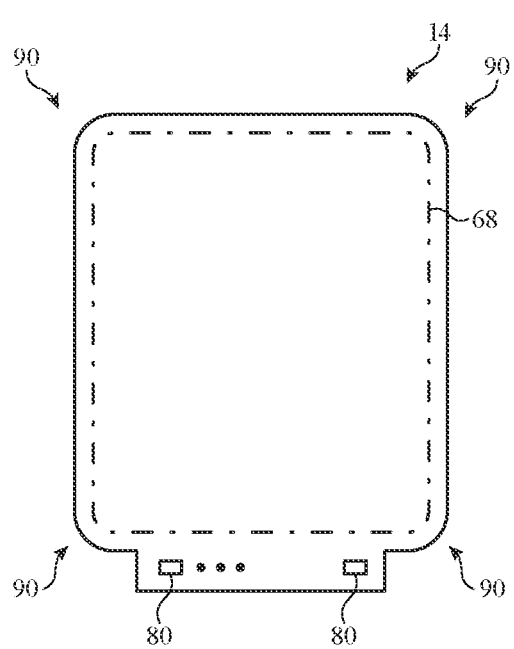
FIGS. 6 and 7 are top views of illustrative displays with crack-stopper border structures in accordance with embodiments.
Figure 7:
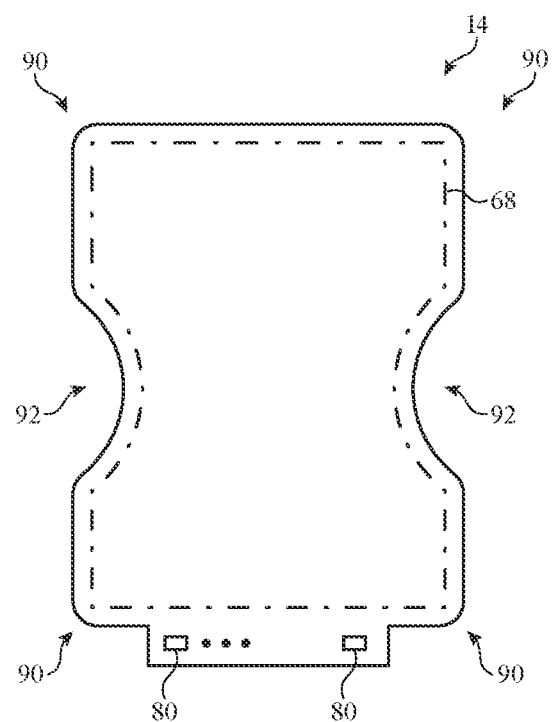

The shape of crack-stopper structure 68 can be defined photolithographically, so a variety of potentially complex shapes can be used for the edge of the pixel array, as shown in the examples of FIG. 6 (e.g., a rectangular display panel having rounded corners 90 and a peripheral strip of crack-stopper structures with corresponding rounded corners) and FIG. 7 (e.g., a rectangular display panel and corresponding strip of crack-stopper structures having curved corners 90 and curved edge portions 92).

The foregoing is merely illustrative and various modifications can be made to the described embodiments. The foregoing embodiments may be implemented individually or in any combination.

What is claimed is:

1. A display, comprising:
a substrate having a peripheral edge;
thin-film circuitry on the substrate that is configured to form pixels, wherein the thin-film circuitry includes a first inorganic dielectric layer and an organic layer that overlaps the first inorganic dielectric layer;
thin-film encapsulation that covers the thin-film circuitry, wherein the thin-film encapsulation includes at least a second inorganic dielectric layer; and
a crack-stopper structure that runs along the peripheral edge and surrounds the pixels, wherein the first and second inorganic dielectric layers overlap the crack-stopper structure, the crack-stopper structure comprising:
a portion of the organic layer; and
a polymer line with tapered sidewalls, wherein the tapered sidewalls form an overhang that overlaps the portion of the organic layer.

2. The display defined in claim 1 wherein the pixels comprise organic light-emitting diode pixels and wherein the polymer line with the tapered sidewalls comprises one of a plurality of polymer lines on the portion of the organic layer, wherein each of the polymer lines has tapered sidewalls.

3. The display defined in claim 2 wherein the crack-stopper structure includes a strip-shaped portion of the first inorganic dielectric layer that runs parallel to the peripheral edge.

4. The display defined in claim 3 wherein the polymer lines with the tapered sidewalls have lower portions and upper portions, wherein the lower portions are closer to the portion of the organic layer than the upper portions, and wherein the lower portions of each polymer line are narrower than the upper portions of that polymer line.

5. The display defined in claim 4 wherein the strip-shaped portion of the first inorganic dielectric layer is patterned to form a plurality of first inorganic dielectric layer lines, each adjacent pair of the first inorganic dielectric layer lines being separated by a respective slot-shaped opening in the strip-shaped portion of the first inorganic dielectric layer.

6. The display defined in claim 5 wherein the portion of the organic layer comprises a strip-shaped portion of the organic layer that runs parallel to the peripheral edge.

7. The display defined in claim 6 wherein each of the polymer lines with the tapered sidewalls runs parallel to the peripheral edge and wherein the second inorganic dielectric layer overlaps the polymer lines with the tapered sidewalls.

8. The display defined in claim 7 wherein the polymer lines include at least five polymer lines.

9. The display defined in claim 7 wherein the polymer lines each have a first width, wherein the polymer lines are separated from each other by slot-shaped openings that each have a second width, and wherein the second width is less than the first width.

10. A display, comprising:
a substrate having a peripheral edge;
thin-film transistor circuitry on the substrate that is configured to form pixels, wherein the thin-film transistor circuitry includes a first inorganic dielectric layer;
thin-film encapsulation that covers the thin-film transistor circuitry, wherein the thin-film encapsulation includes at least a second inorganic dielectric layer; and
a line of crack-stopper structures that surrounds the pixels, wherein the line of crack stopper structures comprises a plurality of parallel polymer lines that are overlapped by the second inorganic dielectric layer, wherein the second inorganic dielectric layer has a first density in regions overlapping the polymer lines and a second density that is less than the first density in regions interposed between each of the polymer lines.

11. The display defined in claim 10 wherein the pixels comprise organic light-emitting diode pixels, wherein each of the polymer lines has tapered sidewalls, wherein the polymer lines with the tapered sidewalls each have a lower portion and an upper portion, and wherein the lower portion of each of the polymer lines is narrower than the upper portion of that polymer line.

12. The display defined in claim 11 wherein the line of crack-stopper structures includes a plurality of lines formed from the first inorganic dielectric layer and wherein the lines formed from the first inorganic dielectric layer are separated from each other by slot-shaped openings and run parallel to the peripheral edge.

13. The display defined in claim 12 wherein the thin-film transistor circuitry further comprises an organic layer that overlaps the first inorganic dielectric layer, wherein the line of crack-stopper structures includes a strip of the organic layer that overlaps the lines of the first inorganic dielectric layer and that extends parallel to the peripheral edge.

14. The display defined in claim 13 wherein the polymer lines each have a first width, wherein the polymer lines are separated from each other by gaps, wherein each gap has a second width, and wherein the second width is less than the first width.

15. The display defined in claim 14 wherein the second inorganic dielectric layer comprises first and second silicon nitride layers.

16. A display, comprising:
a substrate having a peripheral edge;
thin-film circuitry on the substrate that is configured to form pixels, wherein the thin-film circuitry includes a first inorganic dielectric layer and includes an organic layer that overlaps the first inorganic dielectric layer;
thin-film encapsulation that covers the thin-film circuitry, wherein the thin-film encapsulation includes a second inorganic dielectric layer; and
a crack-stopper structure that surrounds the pixels, wherein the crack stopper structure comprises parallel polymer lines that are overlapped by the second inorganic dielectric layer, wherein the polymer lines include first and second polymer lines, wherein the polymer lines each have a first surface and a second surface and a first width from the first surface to the second surface, wherein the polymer lines are separated from each other by a gap that extends from a first surface of the first polymer line to the second surface of the second polymer line and wherein the gap has a second width that is less than the first width.

17. The display defined in claim 16 wherein the pixels comprise light-emitting diode pixels and wherein each of the polymer lines has tapered sidewalls with upper portions and lower portions that are narrower than the upper portions.

18. The display defined in claim 17 wherein the crack-stopper structure includes a plurality of inorganic lines formed from the first inorganic dielectric layer.

19. The display defined in claim 18 wherein the organic layer has a strip-shaped portion in the crack-stopper structure that overlaps the plurality of inorganic lines.

20. The display defined in claim 19 wherein the second width is less than half of the first width.

* * * * *